United States Patent [19]

Le Sergent et al.

[11] 4,117,802

[45] Oct. 3, 1978

[54] METHOD AND DEVICE FOR DEPOSITING A LAYER OF GLASS ON THE INNER WALL OF A TUBE

[75] Inventors: Christian Le Sergent, Marcoussis; Michel Liegois, Paris, both of France

[73] Assignee: Compagnie Generale d'Electricite, Paris, France

[21] Appl. No.: 827,273

[22] Filed: Aug. 24, 1977

[30] Foreign Application Priority Data

Sep. 9, 1976 [FR] France .................. 76 27073

[51] Int. Cl.$^2$ .............................. B05C 7/04
[52] U.S. Cl. ............................. 118/48; 264/81; 427/237; 425/470
[58] Field of Search .......... 118/48, 49.5, 49.1, 118/50.1; 427/237, 167, 248 R, 229, 249, 252, 253, 300, 46; 264/81; 425/470, 471

[56] References Cited

U.S. PATENT DOCUMENTS

| 2,783,164 | 2/1957 | Hill | 118/504 |
| 2,953,483 | 9/1960 | Torok | 118/63 |
| 3,417,453 | 12/1968 | Clarke | 118/48 |
| 3,686,378 | 8/1972 | Dietze | 264/81 |

Primary Examiner—Sam Silverberg
Attorney, Agent, or Firm—Sughrue, Rothwell, Mion, Zinn and Macpeak

[57] ABSTRACT

A reactive gaseous mixture which reacts in a localized heating zone to form a glass deposit on the inner wall of a tube is made to flow along the tube, and in the heating zone it is channelled around a cylindrical element which occupies much of the bore of the tube. The glass deposit is used for making glass fibres for telecommunications.

6 Claims, 1 Drawing Figure

U.S. Patent     Oct. 3, 1978     4,117,802
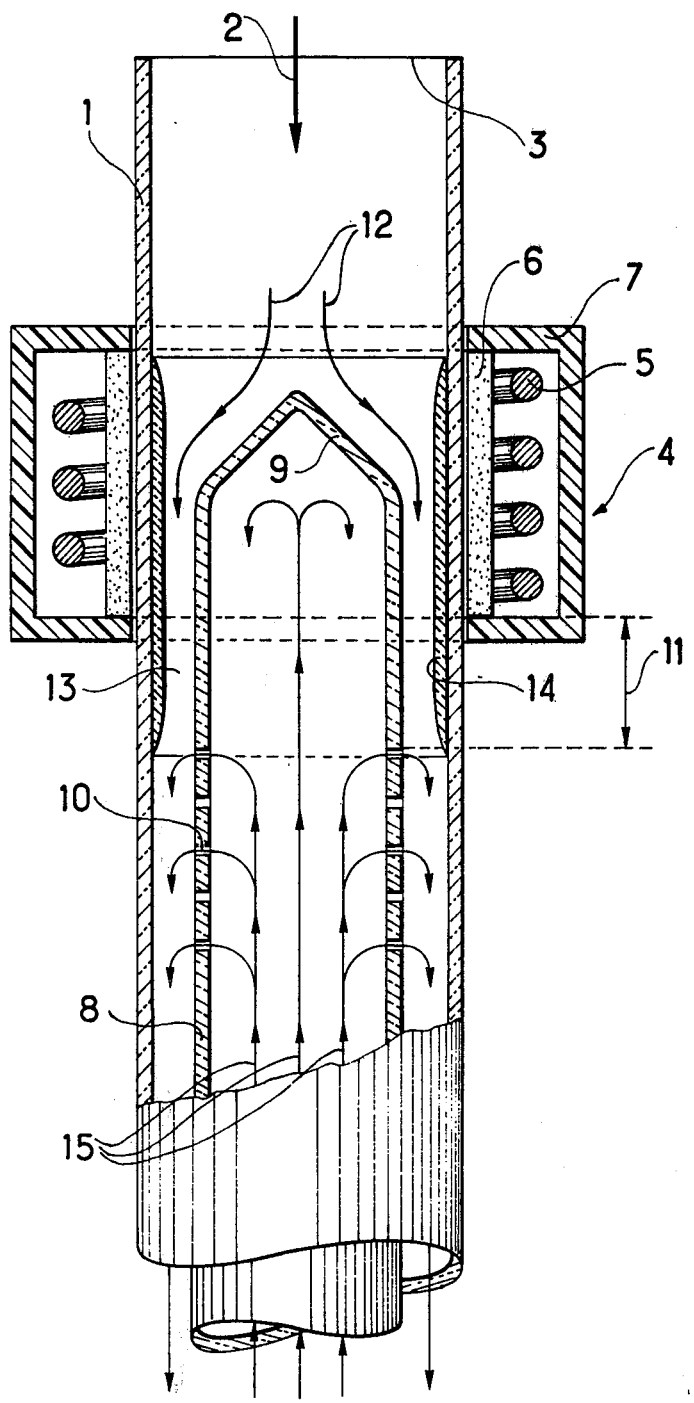

METHOD AND DEVICE FOR DEPOSITING A LAYER OF GLASS ON THE INNER WALL OF A TUBE

FIELD OF THE INVENTION

The present invention relates to a method and a device for depositing a layer of glass on the inner wall of a tube and more particularly on the inner wall of a silica tube.

BACKGROUND OF THE INVENTION

In the manufacture of optical fibres, it is known to form fibre blanks by depositing a layer of glass in the vapour phase on the inner wall of a silica tube. To do this, a mixture of volatile chemical compounds is made to flow in the silica tube and this tube is heated locally by known means. The chemical compounds are suitable for reacting together in contact with the heated part of the tube to form oxides which are deposited in the form of glass on the inner wall of the tube. The layer of glass is deposited in the heated zone of the tube and can be extended to the entire tube by slowly moving the heating means along the tube. By choosing suitably the volatile chemical compounds, a layer of glass having a predetermined refractive index can be deposited. The blank thus formed is elongated by known methods with a view to forming an optical fibre.

The known method of vapour phase deposition has disadvantages:

Firstly the deposition efficiency is relatively low, since a large portion of chemical compounds leaves the tube without having reacted;

Further, appreciable variations in composition and thickness of the deposit can appear along the tube.

Preferred embodiments of the present invention mitigate the disadvantages.

SUMMARY OF THE INVENTION

The present invention provides a method of depositing a layer of glass on the inner wall of a tube constituted mainly of silica, the method comprising the steps of:

providing a gaseous mixture containing volatile chemical compounds suitable for reacting together to form said glass;

causing said gaseous mixture to flow inside said tube, from one end of the tube to the other;

heating said tube over a part of its length; and moving the heated part along said tube, so as to cause said compounds to react together and deposit said layer of said glass on the inner wall of the tube, wherein the flow of the gaseous mixture from the first end to the second end of said tube is between the inner wall of said tube and a cylindrical surface centered on the axis of the tube, situated inside the tube and fixed in relation to the heating zone, this cylindrical surface extending axially in the heating zone and downstream from this zone in relation to the direction of gaseous flow.

The present invention also provides a device for depositing a layer of glass on the inner wall of a tube constituted mainly of silica, the device comprising:

means for causing a flow inside said tube, from one end to the other of the tube of a gaseous mixture containing valatile chemical compounds suitable for reacting together to form said glass;

means for heating said glass along a part of its length;

means for moving said tube and said heating means in relation to each other along the axis of the tube so as to cause said compounds to react together and deposit a layer of said glass on the inner wall of the tube; and a cylindrical element disposed inside said tube, the cylindrical element being fixed in relation to said heating means, the tube and the cylindrical element being coaxial, a first end of the cylindrical element being situated in the vicinity of the zone heated by said heating means, the second end of the cylindrical element being situated downstream from said zone in relation to the flow direction of said gaseous mixture, the cylindrical element defining between its outer cylindrical surface and the inner wall of the tube a space in which said gaseous mixture is channelled.

BRIEF DESCRIPTION OF THE DRAWING

The invention is described hereinbelow by way of an illustration having no limiting character, with reference to the accompanying drawing in which the single FIGURE shows schematically an embodiment of a device suitable for implementing the method of the invention.

DESCRIPTION OF THE PREFERRED EMBODIMENT

In the FIGURE, part of a tube 1 is shown disposed vertically and constituted mainly of silica or preferably of pure silica. A gas containing volatile chemical compounds is made to flow in this tube by known means. This gas can be for example a mixture of oxygen and of vapours of $SiCl_4$ and $POCl_3$. These vapours are in a ratio corresponding to the composition of the glass which it is intended to form. The gas flows in the direction of the arrow 2 from the upper end 3 of the tube 1 towards its lower end, not shown. The tube 1 is heated locally by means of a blow pipe or as illustrated by means of a cylindrical furnace 4 surrounding the outer surface of the tube along a part of its length. The furnace 4 can be for example an induction furnace comprising an induction winding 5 fed by a high-frequency electrical source, not shown, and a heating element constituted by a graphite sleeve 6, the winding 5 and the sleeve 6 being disposed inside an insulating frame 7. A cylindrical element 8 centered on the axis of the tube 1 is placed inside the tube 1. The upper end 9 of the cylindrical element 8 is placed downstream from the heated zone or as shown in the heating zone of the furnace 4 and its lower end, not shown in the FIGURE, is downstream from this heating zone in relation to the direction of flow 2 of the gas.

The upper end 9 of the cylindrical element 8 can have the conical form shown in the FIGURE so as to obtain a progressive reduction of the flow cross-section of the flowing gas it progresses.

The cylindrical element 8 is constituted preferably as shown in the FIGURE by a tube made for example of silica closed at its upper end 9 and having a plurality of orifices such as 10 passing through its cylindrical wall. These orifices are situated downstream from the heating zone of the tube 1 at a predetermined distance 11 from this zone.

To deposit a layer of glass on the inside wall of the tube 1, the tube 1 is moved parallel to its axis so that the heated part of this tube concerns firstly for example the upper part of this tube, on the same side as the end 3. The tube is therefore pulled vertically slowly upwards, the furnace 4 remaining fixed until the heated part reaches the lower end of the tube, then it is continuously moved axially towards the bottom until the heated part reaches its upper end again. The linear movement can be accompanied by a continuous rotating movement of the tube about its axis, this making it possible to improve the homogeneity and the constancy of the thickness of the deposit. During the whole operation, the cylindrical element 8 remains fixed in relation to the furnace 4 in the position shown in the FIGURE.

The gas flowing in the tube 1 is therefore channelled as shown by the arrows 12, when passing through the heating zone and downstream from this zone in relation to the direction of flow of the gas, in a space 13 comprised between the inner wall of the tube 1 and the outer cylindrical surface of the element 8.

Under the action of heat, the chemical compounds of the gas flowing react together to form glass. In the example chosen, the oxidation of $SiCl_4$ and of $POCl_3$ make it possible to obtain silica $SiO_2$ and phosphorus pentoxide $P_2O_5$. The mixture of these oxides is deposited on the inner wall of the tube 1 in the form of a layer 14 of glass doped with phosphorus pentoxide in the heating zone of the tube and downstream from this zone under the influence of the speed of the gas flow. This layer progressively coats the whole inner surface of the tube during the operation.

It is observed that the efficiency of deposition of the layer is improved in relation to the method according to the prior art mentioned hereinabove. This increase in efficiency can be explained by the fact that the gas flow is channelled close to the hot wall of the tube. It should be observed that the glass deposit affects only slightly the outer surface of the cylindrical element 8, which is much less heated than the tube 1.

The embodiment of the element 8 shown in the FIGURE makes it possible further to reduce the quantity of deposited glass on the outer surface of this element. Indeed, in this case, a gas which is neutral in relation to the reactive chemical compounds is injected into the tubular element 8 in the direction shown by arrows 15, this neutral gas possibly being nitrogen at ambient temperature. This neutral gas cools the walls of the element 8, this having the effect of further reducing the amount of the glass deposited on its surface. This neutral gas which is inserted at a pressure lower than that of the gas flowing in the tube 1 passes through the openings 10 of these elements and mixes with the gas containing the reactive products which come out of the space 13 in the direction of the arrows 12. The mixture of the two gases is channelled between the tubes 1 and 8 towards the lower end of the device. This flow of neutral gas has the effect of diluting and cooling the reactive gas and of practically preventing any deposit of glass on the inner wall of the tube 1 below the orifices 10 defined by the predetermined distance 11. The constancy of the thickness and of the composition of the deposit along the tube are thus improved.

In another example of embodiment (not shown) of the device according to the invention, the tube 8 is closed at its lower end and open at its upper end, the neutral gas then being injected in the direction of flow of the reactive gases, the upper end 9 of the cylindrical element 8 being upstream from the heating zone.

After deposit of several layers of glass whose composition and thickness have been chosen so as to form a profile with a suitable refractive index, a blank is obtained which enables optical fibres to be formed by drawing according to known methods. These glass fibres can be used in particular in the telecommunications industry.

What we claim is:

1. A device for depositing a layer of glass on the inner wall of a tube constituted mainly of silica, said device comprising:

means for causing a flow inside said tube, from one end to the other of the tube of a gaseous mixture containing volatile chemical compounds suitable for reacting together to form said glass;

means for heating said tube along a part of its length;

means for moving said tube and said heating means in relation to each other along the axis of the tube so as to cause said compounds to react together and deposit a layer of said glass on the inner wall of tube;

a cylindrical element disposed inside said tube, said cylindrical element being fixed in relation to said heating means, the tube and the cylindrical element being coaxial, a first end of the cylindrical element being situated in the vicinity of the zone heated by said heating means, the second end of the cylindrical element being situated downstream from said zone in relation to the flow direction of said gaseous mixture, said cylindrical element defining between its outer cylindrical surface and the inner wall of the tube a space in which said gaseous mixture is channelled, said cylindrical element being tubular along the greater part of its length, said cylindrical tubular element being closed at one of its ends and including a plurality of orifices passing through its cylindrical wall, said orifices being situated downstream from said heating zone, and wherein the device includes means for injecting a cooling gas in said cylindrical tubular element by its other end in order to cool said element, the cooling gas being neutral in relation to the volatile chemical compounds, the cooling gas passing through said orifices to mix with said first gas.

2. A device according to claim 1, wherein said cylindrical tubular element is made of silica.

3. A device according to claim 1, wherein said orifices are placed at a predetermined distance from said heating zone.

4. A device according to claim 1, wherein the first end of said cylindrical element is substantially conical so as to reduce progressively the flow cross-section of said gaseous mixture as it progresses towards said space.

5. A device according to claim 2, wherein the first end of said cylindrical element is substantially conical so as to reduce progressively the flow cross-section of said gasous mixture as it progresses towards said space.

6. A device according to claim 3, wherein the first end of said cylindrical element is substantially conical so as to reduce progressively the flow cross-section of said gaseous mixture as it progresses towards said space.

* * * * *